United States Patent
Oda

(10) Patent No.: US 12,295,130 B2
(45) Date of Patent: May 6, 2025

(54) MODULE INCLUDING A GROOVED SHIELD FILM

(71) Applicant: Murata Manufacturing Co., Ltd., Kyoto-fu (JP)

(72) Inventor: Tetsuya Oda, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 177 days.

(21) Appl. No.: 18/149,819

(22) Filed: Jan. 4, 2023

(65) Prior Publication Data
US 2023/0144540 A1    May 11, 2023

Related U.S. Application Data

(63) Continuation of application No. PCT/JP2021/024981, filed on Jul. 1, 2021.

(30) Foreign Application Priority Data

Jul. 10, 2020  (JP) .................................. 2020-119241

(51) Int. Cl.
H05K 9/00   (2006.01)
H05K 1/18   (2006.01)
H05K 3/28   (2006.01)

(52) U.S. Cl.
CPC ........... *H05K 9/0022* (2013.01); *H05K 3/284* (2013.01); *H05K 1/181* (2013.01); *H05K 2203/107* (2013.01); *H05K 2203/1322* (2013.01)

(58) Field of Classification Search
CPC .................. H05K 9/0022; H05K 1/181; H05K 2203/107; H05K 2203/1322;
(Continued)

(56) References Cited

U.S. PATENT DOCUMENTS

2015/0043170 A1* 2/2015 Shimamura ............ H05K 3/284
                                                              361/728
2015/0062835 A1   3/2015 Kai et al.
(Continued)

FOREIGN PATENT DOCUMENTS

JP   2015-057802 A    3/2015
JP   2015-072935 A    4/2015
(Continued)

OTHER PUBLICATIONS

International Search Report for PCT/JP2021/024981 dated Sep. 7, 2021.

*Primary Examiner* — James Wu
*Assistant Examiner* — Dakota M Talbert
(74) *Attorney, Agent, or Firm* — MCDONALD HOPKINS LLC

(57) ABSTRACT

A module includes a substrate including a first surface, a first component mounted on the first surface, at least a part of a surface of which on a side distant from the substrate is covered with a first conductive film, a sealing resin arranged to cover the first surface and the first component, and a shield film that covers at least a part of a surface of the sealing resin on the side distant from the substrate. The shield film includes a first shield portion superimposed on at least a part of the first conductive film and a second shield portion. The first shield portion is isolated from the second shield portion by a groove that divides the shield film and is provided to such a depth as entering the sealing resin. The first shield portion is electrically independent.

11 Claims, 5 Drawing Sheets

(58) Field of Classification Search
CPC ...... H05K 1/0298; H05K 1/185; H05K 1/056; H05K 2201/0707
See application file for complete search history.

(56) References Cited

U.S. PATENT DOCUMENTS

| | | | |
|---|---|---|---|
| 2017/0338031 A1 | 11/2017 | Miyahara | |
| 2017/0347462 A1* | 11/2017 | Miwa | H01L 21/561 |
| 2019/0122993 A1 | 4/2019 | Kim | |
| 2019/0311994 A1* | 10/2019 | Hong | H01L 21/56 |
| 2020/0043866 A1 | 2/2020 | Fujii et al. | |
| 2020/0137931 A1* | 4/2020 | Lee | H05K 9/0031 |

FOREIGN PATENT DOCUMENTS

| | | |
|---|---|---|
| JP | 2019-080029 A | 5/2019 |
| JP | 6624026 B2 | 12/2019 |
| WO | 2018/194012 A1 | 10/2018 |

* cited by examiner

MODULE INCLUDING A GROOVED SHIELD FILM

CROSS REFERENCE TO RELATED APPLICATION

This is a continuation of International Application No. PCT/JP2021/024981 filed on Jul. 1, 2021 which claims priority from Japanese Patent Application No. 2020-119241 filed on Jul. 10, 2020. The contents of these applications are incorporated herein by reference in their entireties.

BACKGROUND OF THE DISCLOSURE

Field of the Disclosure

The present disclosure relates to a module.

Description of the Related Art

With increase in number of components in the inside of an electronic device such as a smartphone and reduction in size and a lower profile of the electronic device in recent years, noise interference between electronic components included in the electronic device gives rise to a problem. In order to prevent noise interference, use of a shield film in a communication module product has been demanded. For example, Japanese Patent Laying-Open No. 2015-57802 (PTL 1) describes a circuit module including a shield film. This circuit module includes a sealing body composed of an insulating resin, and a shield film is provided to cover an outer surface of the sealing body. For forming such a shield film, a method such as plating or sputtering is generally used.

In a single module, a plurality of electronic components may be mounted on an identical substrate, and noise interference between different electronic components on the identical substrate may also give rise to a problem. In order to suppress such noise interference between the electronic components, as described, for example, in Japanese Patent No. 6624026 (PTL 2), an electronic component in such a structure that a shield film is provided on an upper surface and a side surface of the electronic component itself (which is referred to as a "shield-film-equipped electronic component" below) has also been proposed.

PTL 1: Japanese Patent Laying-Open No. 2015-57802
PTL 2: Japanese Patent No. 6624026

BRIEF SUMMARY OF THE DISCLOSURE

In referring to a "shield-film-equipped electronic component" below, the term "shield film" is used. An element like a shield film provided on the outer surface of the electronic component, however, is not necessarily grounded and it may also serve as some kind of an interconnection.

A module can be constructed by mounting a shield-film-equipped electronic component on a substrate, providing resin sealing to cover the shield-film-equipped electronic component, and forming a shield film over an upper surface of the sealing resin. When an upper surface of the shield-film-equipped electronic component is not sufficiently distant from the upper surface of the sealing resin, a signal may propagate between the shield film formed on the upper surface of the electronic component and the shield film provided on the upper surface of the sealing resin of the module, which may lead to failure in obtaining a desired characteristic.

In general, a shield film provided on an outer surface of a sealing resin of a module is designed to be grounded by such a method as electrical connection to a ground line exposed at a side surface of a substrate, and by being grounded, it exhibits a shielding effect. The shield film provided on the outer surface of the shield-film-equipped electronic component, on the other hand, is not necessarily grounded, and it is also often used as a part of a line for L or C. In that case, the shield film provided on the outer surface of the shield-film-equipped electronic component is different in potential from the shield film provided on the outer surface of the sealing resin of the module. Therefore, a parasitic capacitance may be caused between the shield film provided on the outer surface of the shield-film-equipped electronic component and the shield film provided on the outer surface of the sealing resin of the module. Occurrence of such a parasitic capacitance is also a factor for lowering in performance as the module.

Even when the shield film provided on the outer surface of the shield-film-equipped electronic component is grounded, a parasitic capacitance may be caused as below. The principles of shielding are to make a noise signal flow to a ground electrode through a shield film which is a conductive film at a low resistivity, and the shield film ideally has a resistance of 0. Actually, however, the shield film has a certain resistivity. Therefore, the noise signal cannot completely flow away, the potential as the shield film does not attain to an ideal ground potential, and the potential varies with the noise signal. When the module handles a high frequency, a phase difference of noise depending on a location is noticeable, and hence influence by the phase difference of the potential may be exhibited at a distant location. For such reasons, the parasitic capacitance may be caused between the shield film provided on the outer surface of the shield-film-equipped electronic component and the shield film provided on the outer surface of the sealing resin of the module.

A possible benefit of the present disclosure is to provide a module capable of suppressing occurrence of a parasitic capacitance between a shield film provided in a shield-film-equipped electronic component and a shield film provided on a surface of a sealing resin of the module.

In order to achieve the possible benefit, a module based on the present disclosure includes a substrate including a first surface, a first component mounted on the first surface, at least a part of a surface of which on a side distant from the substrate in a direction perpendicular to the first surface is covered with a first conductive film, a sealing resin arranged to cover the first surface and the first component, and a shield film that covers at least a part of a surface of the sealing resin on the side distant from the substrate in the direction perpendicular to the first surface. The shield film includes a first shield portion superimposed on at least a part of the first conductive film when viewed in the direction perpendicular to the first surface and a second shield portion different from the first shield portion, the first shield portion is isolated from the second shield portion by a groove that divides the shield film and is provided to such a depth as entering the sealing resin, and the first shield portion is electrically independent.

According to the present disclosure, the electrically independent first shield portion is in such positional relation as being superimposed on at least a part of the first conductive film of the first component. Therefore, occurrence of a parasitic capacitance between the shield film provided in the shield-film-equipped electronic component and the shield film provided on the surface of the sealing resin of the module can be suppressed.

DETAILED DESCRIPTION OF THE DISCLOSURE

Figure 1:
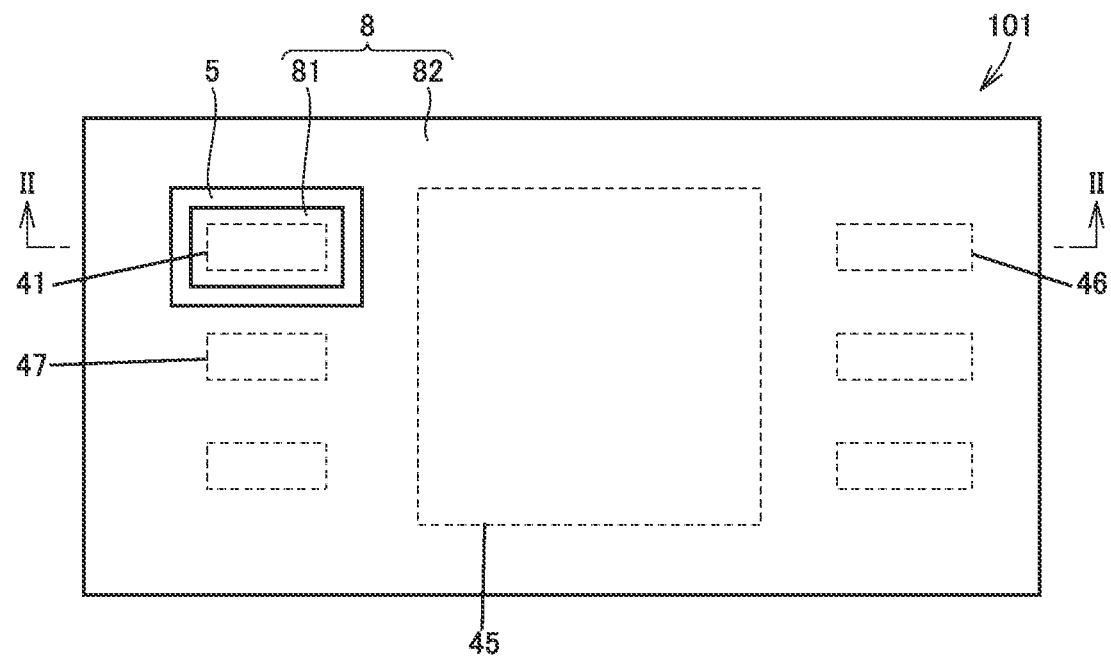
FIG. 1 is a plan view of a module in a first embodiment based on the present disclosure.

A dimensional ratio shown in the drawings does not necessarily faithfully represent an actual dimensional ratio and a dimensional ratio may be exaggerated for the sake of convenience of description. A concept up or upper or down or lower mentioned in the description below does not mean absolute up or upper or down or lower but may mean relative up or upper or down or lower in terms of a shown position.

First Embodiment

Figure 2:
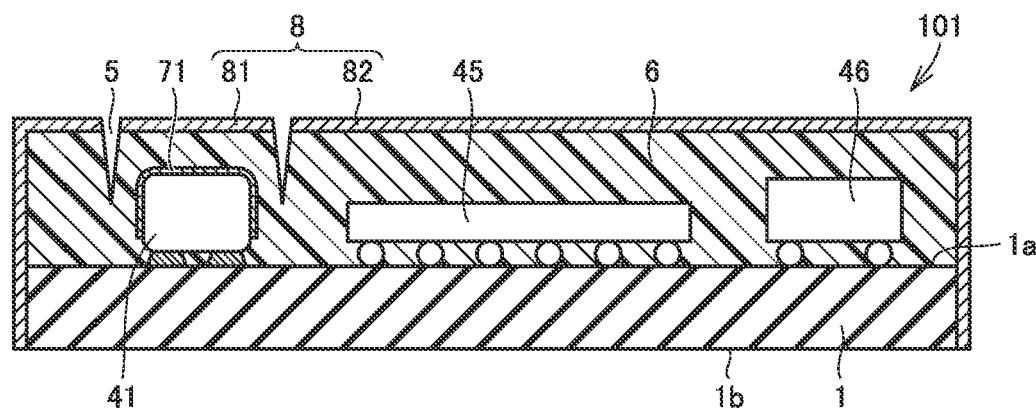
FIG. 2 is a cross-sectional view along the line II-II in FIG. 1.
Figure 3:
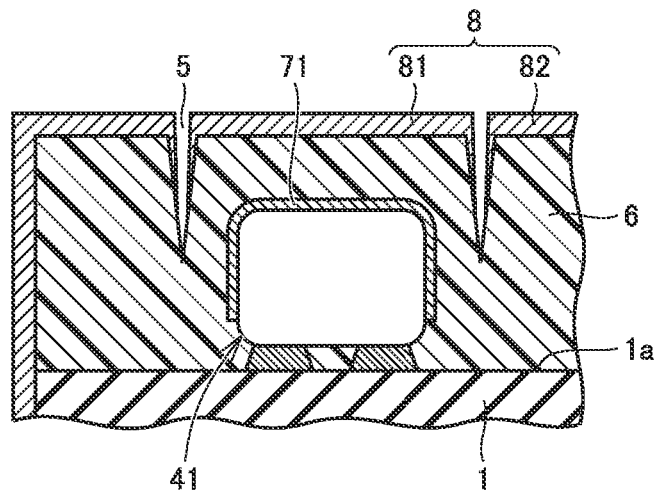
FIG. 3 is an enlarged cross-sectional view of a first component of the module and the vicinity thereof in the first embodiment based on the present disclosure.

A module in a first embodiment based on the present disclosure will be described with reference to FIGS. 1 to 3. FIG. 1 shows a plan view of a module 101 in the present embodiment. FIG. 2 shows a cross-sectional view along the line II-II in FIG. 1.

Module 101 in the present embodiment includes a substrate 1 including a first surface 1a, a first component 41 mounted on first surface 1a, at least a part of a surface of which on a side distant from substrate 1 in a direction perpendicular to first surface 1a is covered with a first conductive film 71, a sealing resin 6 arranged to cover first surface 1a and first component 41, and a shield film 8 that covers at least a part of a surface of sealing resin 6 on the side distant from substrate 1 in the direction perpendicular to first surface 1a. Substrate 1 includes a second surface 1b as a surface opposite to first surface 1a. Substrate 1 may be a resin substrate or a ceramic substrate. Substrate 1 may be a multilayer substrate. In other words, substrate 1 may be a resin multilayer substrate or a ceramic multilayer substrate. First component 41 includes first conductive film 71.

Shield film 8 includes a first shield portion 81 superimposed on at least a part of first conductive film 71 when viewed in the direction perpendicular to first surface 1a and a second shield portion 82 different from first shield portion 81. First shield portion 81 is isolated from second shield portion 82 by a groove 5 that divides shield film 8 and is provided to such a depth as entering sealing resin 6. First shield portion 81 is electrically independent. "Being electrically independent" means being electrically connected to no other conductor and being in what is called a floating state.

In other words, first shield portion 81 is not conducting to second shield portion 82, and additionally, it is not electrically connected to other portions. FIG. 3 shows first component 41 and the vicinity thereof as being enlarged. When viewed in cross-section, groove 5 is in a tapered shape and decreases in width toward a deeper portion. In a part of a side surface of groove 5 close to the upper surface of sealing resin 6, the side surface of groove 5 is covered with shield film 8. For example, as shown in FIG. 3, groove 5 may be provided to a position deeper than the upper surface of first component 41.

Shield film 8 may be, for example, a film formed by sputtering. Shield film 8 may be in a layered structure composed of a plurality of layers. Shield film 3 may be, for example, in a three-layered structure. Shield film 8 may be in a three-layered structure including, for example, an adhesive layer, a conductive layer, and a protective layer. The adhesive layer may be formed, for example, of SUS, Ti, Cr, Ni, or the like. The conductive layer may be formed, for example, of Cu. The protective layer may be formed, for example, of SUS, Ti, Ni, or the like.

In the present embodiment, first shield portion 81 is isolated from second shield portion 82 by groove 5. Therefore, even when at least a part of first conductive film 71 is in such positional relation as being superimposed on first shield portion 81, no parasitic capacitance is caused. First component 41 as the shield-film-equipped electronic component includes first conductive film 71 as the shield film in this module 101, and occurrence of the parasitic capacitance between this shield film and the shield film provided on the surface of the sealing resin of the module can be suppressed.

As shown in the present embodiment, when viewed in the direction perpendicular to first surface 1a, groove 5 is preferably arranged to surround first component 41. By adopting this construction, first shield portion 81 corresponding to first component 41 can completely be isolated from second shield portion 82 therearound, and electrical independency thereof can be ensured. Thus, occurrence of the parasitic capacitance can more reliably be suppressed.

As shown in the present embodiment, groove 5 is preferably in such a tapered shape as decreasing in width toward a deeper portion. By adopting this construction, shield film 8 is less likely to be formed deep in groove 5, and such a construction that first shield portion 81 is isolated from second shield portion 82 by groove 5 is readily made. Details of a manufacturing method will be described later.

Each of first shield portion 81 and second shield portion 82 may include a portion that covers a part of the side surface of groove 5. By adopting this construction, manufacturing is facilitated.

Manufacturing Method

Figure 4:
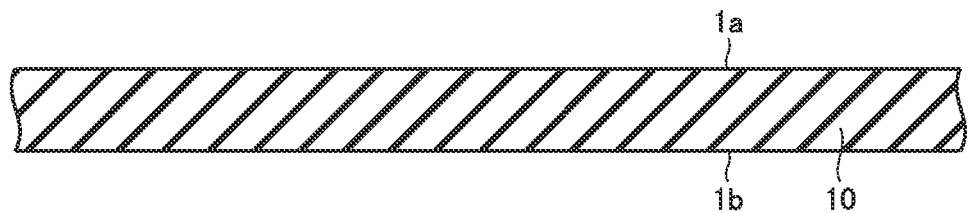
FIG. 4 is an illustrative view of a first step in a method of manufacturing a module in the present embodiment.
Figure 5:
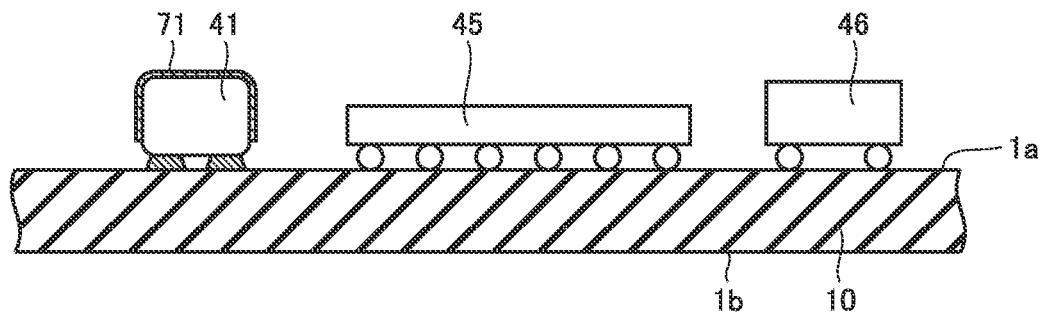
FIG. 5 is an illustrative view of a second step in the method of manufacturing a module in the present embodiment.

A method of manufacturing a module in the present embodiment will be described with reference to FIGS. 4 to 8. Initially, as shown in FIG. 4, a substrate 10 is prepared. Substrate 10 is a substrate having a large size corresponding to a plurality of modules. Substrate 10 is also called a "substrate assembly." Substrate 10 includes first surface 1a and second surface 1b as the surface opposite to first surface 1a. Then, as shown in FIG. 5, first component 41 is mounted on first surface 1a of substrate 10. At this time, another component may be mounted as necessary. In FIG. 5, components 45 and 46 are also mounted by way of example. Though illustration is provided with attention being paid to a portion corresponding to a single module, a component is mounted in a region corresponding to each module, because substrate 10 is the substrate assembly. Though single-sided mount is shown, double-sided mount may be applicable. In other words, a component may be mounted also on second surface 1b.

Figure 6:
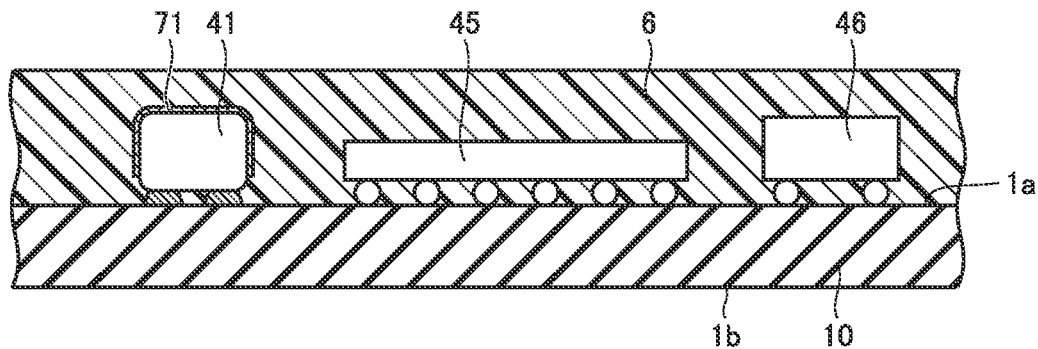
FIG. 6 is an illustrative view of a third step in the method of manufacturing a module in the present embodiment.

As shown in FIG. 6, sealing resin 6 is formed. Sealing resin 6 is formed to cover first surface 1a and a component mounted on first surface 1a. In order to form sealing resin 6, such a method as transfer molding, compression molding, dipping of a liquid resin, or the like can be adopted. Though single-sided mount is shown, in double-sided mount, another sealing resin is formed to cover second surface 1b and a component mounted on second surface 1b.

Figure 7:
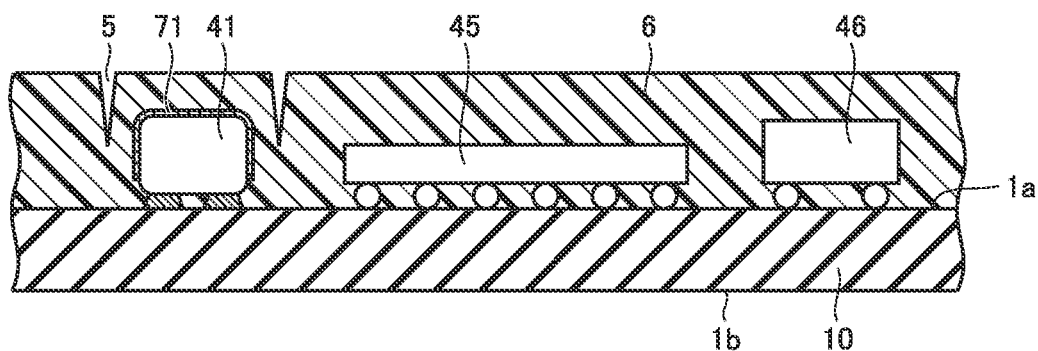
FIG. 7 is an illustrative view of a fourth step in the method of manufacturing a module in the present embodiment.

As further shown in FIG. 7, groove 5 is provided in sealing resin 6. Groove 5 can be provided, for example, by laser machining. Groove 5 in a shape at a high aspect ratio is provided.

Simultaneously with or before or after provision of groove 5, a character, a sign, or a mark may be provided on the upper surface of sealing resin 6, separately from groove 5. In order to do so, laser machining may be used, and for example, such a method as an ink jet method may be used.

Figure 8:
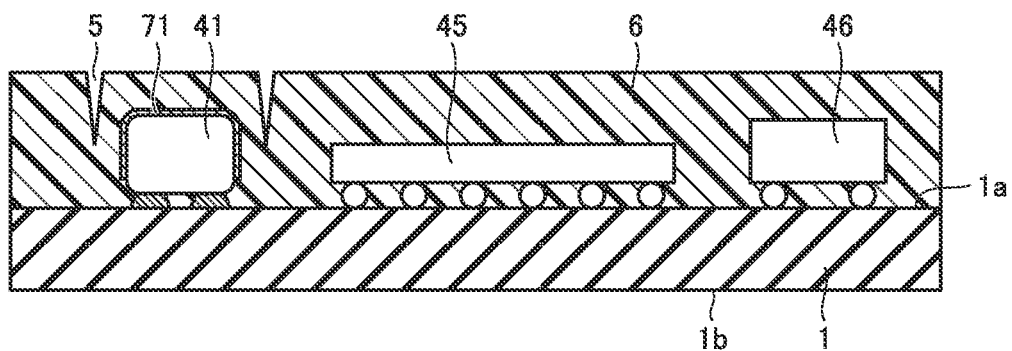
FIG. 8 is an illustrative view of a fifth step in the method of manufacturing a module in the present embodiment.

Then, as shown in FIG. 8, the substrate assembly is divided into substrates each having a size of an individual module. Substrate 10 is divided into substrates 1. For this division, a known technique such as a dicer, laser, scribing, or the like can be used. An interconnection for electrical connection to a second shield layer is exposed at a side surface of substrate 1.

Then, a shield film is formed to cover an upper surface and a side surface of sealing resin 6. For forming the shield film, such a method as sputtering, spraying, or the like can be used. Shield film 8 is thus formed as shown in FIG. 2. In an example where shield film 8 is composed of a plurality of layers, a film is formed a plurality of times. In forming shield film 8 by spraying, a diagonally spraying method may be adopted so as not to form shield film 8 on a bottom of groove 5. Module 101 is thus obtained as shown in FIG. 2. Thereafter, as necessary, a product is cleaned, measured, externally inspected, and packed.

Second Embodiment

Figure 9:
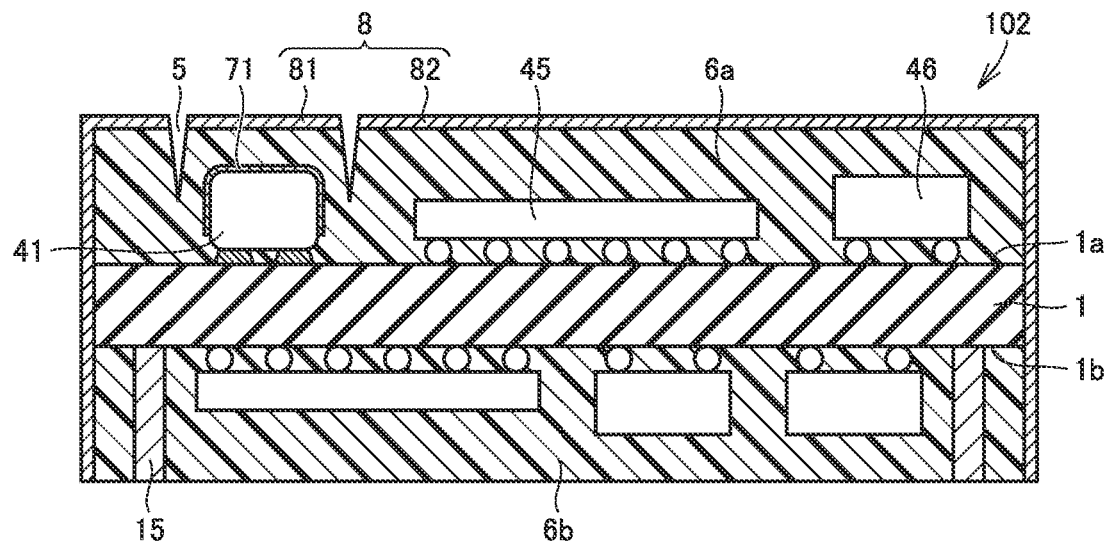
FIG. 9 is a cross-sectional view of a module in a second embodiment based on the present disclosure.

A module in a second embodiment based on the present disclosure will be described with reference to FIG. 9. FIG. 9 shows a module 102 with a double-sided mount structure. In module 102, at least one component is mounted also on second surface 1b of substrate 1. First surface 1a and a component mounted on first surface 1a are covered with a sealing resin 6a. Second surface 1b and a component mounted on second surface 1b are covered with a sealing resin 6b formed separately from sealing resin 6a. An external connection terminal 15 is provided to pass through sealing resin 6b. External connection terminal 15 may be, for example, a columnar conductor and connected to second surface 1b. External connection terminal 15 has a lower end exposed through sealing resin 6b. External connection terminal 15 may have a lower surface covered with a plated film.

Since the double-sided mount structure is adopted in the present embodiment, a larger number of components can be mounted on substrate 1 limited in area. Therefore, the module can readily be higher in function.

Third Embodiment

Figure 10:
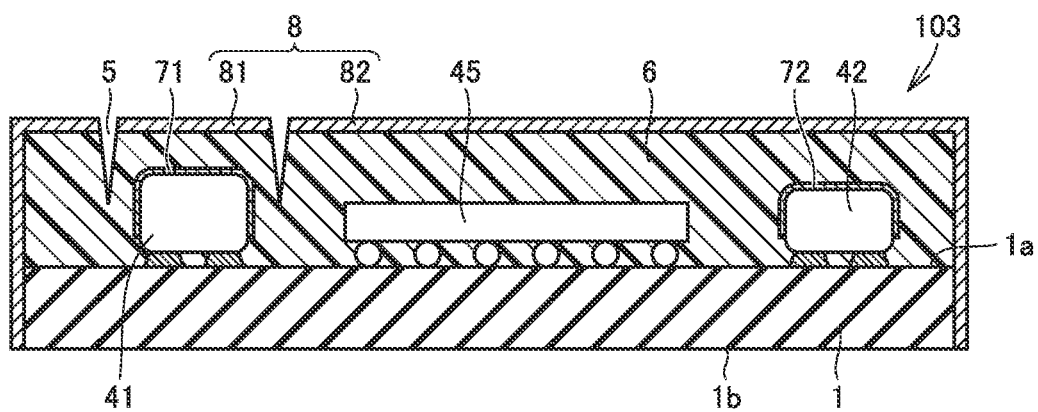
FIG. 10 is a cross-sectional view of a module in a third embodiment based on the present disclosure.

A module in a third embodiment based on the present disclosure will be described with reference to FIG. 10. In a module 103 shown in FIG. 10, a second component 42 in addition to first component 41 is also mounted on first surface 1a of substrate 1. Second component 42 includes a second conductive film 72.

Module 103 includes second component 42 mounted on first surface 1a, at least a part of a surface of which on the side distant from substrate 1 is covered with second conductive film 72. First component 41 is taller than second component 42. In other words, an upper surface of first component 41 is located at a position more distant from first surface 1a than an upper surface of second component 42.

Shield film 8 includes first shield portion 81 superimposed on at least a part of first conductive film 71 of first component 41 when viewed in the direction perpendicular to first surface 1a. In other words, first shield portion 81 is located above first component 41. In the present embodiment, however, there is no first shield portion 81 above second component 42, and second shield portion 82 extends as in other portions.

Thus, in an example where a plurality of components each including a conductive film are mounted on first surface 1a of substrate 1, first shield portion 81 may be provided only in a region corresponding to the tallest component.

Since first shield portion 81 is electrically independent of other portions in the present embodiment, no parasitic capacitance is caused, however, it does not contribute to shield against electromagnetic waves. Such an unprotected region where there is nothing to contribute to shield against electromagnetic waves is preferably as small as possible. In the present embodiment where a plurality of components are mounted on first surface 1a of substrate 1, first shield portion 81 is provided only in a region corresponding to the tallest component. Therefore, an unprotected region can be minimized.

In general, the tallest component among components each including the conductive film tends to suffer from a problem of the parasitic capacitance. In the present embodiment, since first shield portion 81 is arranged only for the tallest component, the problem of the parasitic capacitance can efficiently be solved.

By arranging a tall shield-equipped component and providing first shield portion 81 above first component 41, the parasitic capacitance between the shield film of the shield-equipped component and first shield portion 81 is suppressed while the tall shield-equipped component can suppress noise from another electronic component that goes out of the module through groove 5.

Fourth Embodiment

Figure 11:
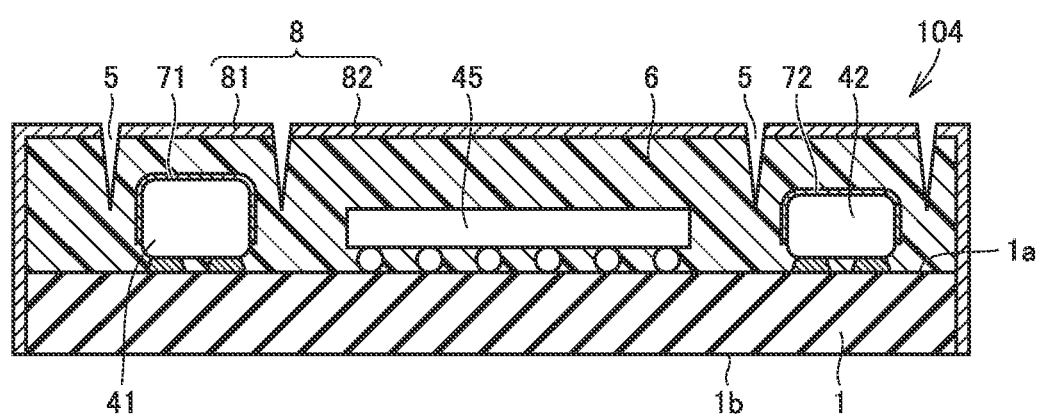
FIG. 11 is a cross-sectional view of a module in a fourth embodiment based on the present disclosure.

A module in a fourth embodiment based on the present disclosure will be described with reference to FIG. 11. In a module 104 shown in FIG. 11, second component 42 in addition to first component 41 is also mounted on first surface 1a of substrate 1. Second component 42 includes second conductive film 72. Unlike the third embodiment, in the present embodiment, first shield portion 81 is provided also in a region corresponding to second component 42.

When the construction is such that a plurality of components each including the conductive film are mounted on first surface 1a of substrate 1 and the problem of the parasitic capacitance is to be solved in each of the plurality of components, first shield portion 81 may be arranged in each of the plurality of components as shown in the present embodiment.

Though there is nothing to contribute to shield against electromagnetic waves in a region where first shield portion 81 is provided, such a construction is also significant when importance is placed on solution of the problem of the parasitic capacitance.

In the present embodiment, the problem of the parasitic capacitance can be solved in each of the plurality of components.

Though an example in which two components each including the conductive film are mounted is shown in the third and fourth embodiments, three or more components as such may be provided. In such a case, as necessary, first shield film 81 may be provided only in the region corresponding to the tallest component, first shield film 81 may be provided only in regions corresponding to some desired components, or first shield film 81 may be provided in a region corresponding to each of all components. A single first shield film 81 may be provided to collectively be superimposed on a plurality of components.

Some features in embodiments above may be adopted as being combined as appropriate.

It should be understood that the embodiments disclosed herein are illustrative and non-restrictive in every respect. The scope of the present disclosure is defined by the terms of the claims and is intended to include any modifications within the scope and meaning equivalent to the terms of the claims.

1 substrate; 1a first surface; 1b second surface; 5 groove; 6, 6a, 6b sealing resin; 8 shield film; 15 external connection terminal; 41 first component; 42 second component; 45, 46, 47 component; 71 first conductive film; 72 second conductive film; 81 first shield portion; 82 second shield portion; 101, 102, 103, 104 module

The invention claimed is:

1. A module comprising:
a substrate including a first surface;
a first component mounted on the first surface, wherein at least a part of a surface of the first component on a side distant from the substrate in a direction perpendicular to the first surface is covered with a first conductive film;
a sealing resin arranged to cover the first surface and the first component; and
a shield film covering at least a part of a surface of the sealing resin on the side distant from the substrate in the direction perpendicular to the first surface, wherein
the shield film includes a first shield portion superimposed on at least a part of the first conductive film when viewed in the direction perpendicular to the first surface and a second shield portion different from the first shield portion, the first shield portion is isolated from the second shield portion by a groove dividing the shield film and provided to such a depth as entering the sealing resin, and the first shield portion is electrically independent.

2. The module according to claim 1, wherein
when viewed in the direction perpendicular to the first surface, the groove is arranged to surround the first component.

3. The module according to claim 1, wherein
the groove is in such a tapered shape as decreasing in width toward a deeper portion.

4. The module according to claim 1, wherein
each of the first shield portion and the second shield portion includes a portion covering a part of a side surface of the groove.

5. The module according to claim 1, further comprising a second component mounted on the first surface, wherein at least a part of a surface of the second component on the side distant from the substrate is covered with a second conductive film, wherein
an upper surface of the first component is located more distant from the first surface than an upper surface of the second component.

6. The module according to claim 2, wherein
the groove is in such a tapered shape as decreasing in width toward a deeper portion.

7. The module according to claim 2, wherein
each of the first shield portion and the second shield portion includes a portion covering a part of a side surface of the groove.

8. The module according to claim 3, wherein
each of the first shield portion and the second shield portion includes a portion covering a part of a side surface of the groove.

9. The module according to claim 2, further comprising a second component mounted on the first surface, wherein at least a part of a surface of the second component on the side distant from the substrate is covered with a second conductive film, wherein
an upper surface of the first component is located more distant from the first surface than an upper surface of the second component.

10. The module according to claim 3, further comprising a second component mounted on the first surface, wherein at least a part of a surface of the second component on the side distant from the substrate is covered with a second conductive film, wherein
an upper surface of the first component is located more distant from the first surface than an upper surface of the second component.

11. The module according to claim 4, further comprising a second component mounted on the first surface, wherein at least a part of a surface of the second component on the side distant from the substrate is covered with a second conductive film, wherein
an upper surface of the first component is located more distant from the first surface than an upper surface of the second component.

* * * * *